United States Patent
Kim et al.

(10) Patent No.: US 11,538,550 B2
(45) Date of Patent: Dec. 27, 2022

(54) SYSTEM AND METHOD FOR REPAIRING MEMORY

(71) Applicant: SK hynix Inc., Icheon-si (KR)

(72) Inventors: Hyun Seok Kim, Icheon-si (KR); Yong Ju Kim, Seoul (KR); Su Hae Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 230 days.

(21) Appl. No.: 16/913,664

(22) Filed: Jun. 26, 2020

(65) Prior Publication Data

US 2021/0090684 A1    Mar. 25, 2021

(30) Foreign Application Priority Data

Sep. 23, 2019   (KR) ........................ 10-2019-0117090

(51) Int. Cl.
| | |
|---|---|
| *G06F 11/10* | (2006.01) |
| *G11C 29/00* | (2006.01) |
| *G06F 12/02* | (2006.01) |
| *G06F 11/08* | (2006.01) |
| *G06F 11/14* | (2006.01) |

(52) U.S. Cl.
CPC .............. *G11C 29/88* (2013.01); *G06F 11/08* (2013.01); *G06F 11/1068* (2013.01); *G06F 12/02* (2013.01); *G06F 11/14* (2013.01); *G06F 2212/1008* (2013.01)

(58) Field of Classification Search
CPC .......... G06F 11/08; G06F 11/10; G06F 11/14; G06F 12/10

USPC ........................................................ 714/6.1
See application file for complete search history.

(56) References Cited

U.S. PATENT DOCUMENTS

| | | | | |
|---|---|---|---|---|
| 2013/0111301 A1* | 5/2013 | Chu | ................... | G11C 29/82 714/766 |
| 2014/0310576 A1* | 10/2014 | Asano | ................. | G06F 11/1008 714/773 |
| 2017/0083402 A1* | 3/2017 | Vishne | ................ | G06F 11/1076 |
| 2017/0091026 A1* | 3/2017 | Gulati | ................. | G06F 11/1068 |
| 2018/0314592 A1* | 11/2018 | Gulati | ................. | G06F 11/1068 |
| 2019/0286519 A1* | 9/2019 | Gulati | .................... | G11C 29/52 |

FOREIGN PATENT DOCUMENTS

| | | |
|---|---|---|
| KR | 101086855 B1 | 11/2011 |
| KR | 1020170041616 A | 4/2017 |

* cited by examiner

*Primary Examiner* — Than Nguyen
(74) *Attorney, Agent, or Firm* — William Park & Associates Ltd.

(57) ABSTRACT

A memory system includes a memory medium and a memory controller. The memory medium has a second address system that is different from a first address system of a host. The memory controller performs a control operation to access the memory medium based on a command from the host. The memory controller is configured to store a second address, corresponding to an address of a read data, when an error of the read data that is outputted from the memory medium is uncorrectable and is configured to repair a region of the memory medium, designated by the second address, when the region of the memory medium that is designated by the second address is repairable.

14 Claims, 4 Drawing Sheets

SYSTEM AND METHOD FOR REPAIRING MEMORY

CROSS-REFERENCE TO RELATED APPLICATION

The present application claims priority under 35 U.S.C 119(a) to Korean Application No. 10-2019-0117090, filed on Sep. 23, 2019, which is herein incorporated by references in its entirety.

BACKGROUND

1. Technical Field

Various embodiments of the present disclosure generally relate to memory systems, and more particularly, to memory systems including memory media having an address system different from an address system of a host and methods of operating the memory systems.

2. Related Art

Recently, data management systems have increased their information processing speed with the improvement of performance of computing systems including multi-core central processing units, large capacity of main memory devices, and high performance auxiliary memory devices. However, the computing systems have not fully exhibited their highest performance because of some operations for preparing against system crashes, occurrence of which is unpredictable. Accordingly, nonvolatile dual in-line memory modules (NVDIMMs), corresponding to hybrid memory modules comprised of dynamic random access memory (DRAM) devices and nonvolatile memory (NVM) devices, have been proposed to solve the above problems, and various technologies have been studied to improve the performance of the computing systems.

Each of the NVDIMMs may have a configuration in which an NVM device, such as a NAND-type flash memory device or a phase change random access memory (PRAM) device, is combined with a memory module with a DRAM device. While DRAM devices lose their stored data when their power supplies are interrupted, the NVM devices may permanently retain their stored data even when their power supplies are interrupted. Thus, even though power supplies of the NVDIMMs are interrupted, temporary data that is generated during operations of the NVDIMMs may be safely stored and recovered. That is, each of the NVDIMMs may have both a backup function and a storage function.

A memory medium, constituting each of the NVDIMMs, may have an address system which is different from an address system of a host. In such a case, when a read data from the memory medium is uncorrectable by error correction operation during access to the memory medium, it may be impossible to find out information on a second address of the read data in the memory medium. Thus, even though the memory medium is repairable by repair operation, a region assigned by a first address that corresponds to the second address may be regarded as a bad block without having to apply any repair process to the memory medium that may cause a problem in which the memory medium cannot be repaired.

SUMMARY

According to an embodiment, a memory system includes a memory medium and a memory controller. The memory medium has a second address system that is different from a first address system of a host. The memory controller performs a control operation to access the memory medium based on a command from the host. The memory controller is configured to store a second address, corresponding to an address of a read data, when an error of the read data that is outputted from the memory medium is uncorrectable and is configured to repair a region of the memory medium, designated by the second address, when the region of the memory medium that is designated by the second address is repairable.

According to another embodiment, there is provided a memory system including a memory module. The memory module includes a memory medium and a module controller. The memory medium includes a volatile memory device and a nonvolatile memory device, at least one of which having a second address system that is different from a first address system of a host. The module controller performs a control operation to access the memory medium based on a command from the host. The memory controller is configured to store a second address, corresponding to an address of a read data, when an error of the read data that is outputted from the memory medium is uncorrectable and is configured to repair a region of the memory medium, designated by the second address, when the region of the memory medium that is designated by the second address is repairable.

According to yet another embodiment, there is provided a method of operating a memory system including a memory medium having a second address system which is different from a first address system of a host. The method includes converting a first address that is outputted from the host into a second address, accessing to a read data that is stored in a region of the memory medium designated by the second address, storing the second address of the read data when the read data is uncorrectable, and repairing the region of the memory medium that is designated by the second address when the region of the memory medium designated by the second address is repairable.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
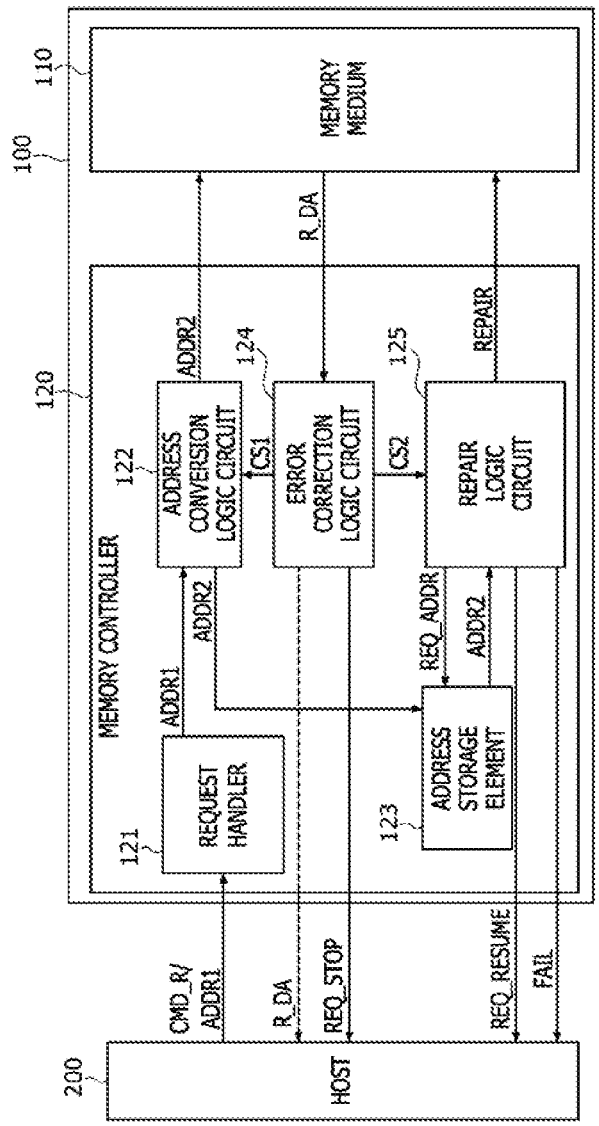
FIG. 1 is a block diagram, illustrating a memory system, according to an embodiment of the present disclosure.

FIG. 1 is a block diagram, illustrating a memory system 100, according to an embodiment of the present disclosure. Referring to FIG. 1, the memory system 100 may be configured to include a memory medium 110 and a memory controller 120. The memory medium 110 may include memory devices with a second address system that is different from a first address system of a host 200. In the present embodiment, the memory devices, constituting the memory medium 110, may be volatile memory devices or nonvolatile memory devices having an address system that is different from the address system of the host 200. In an embodiment, while a first address ADDR1 that is transmitted from the host 200 to the memory system 100 has no bank/column/row information with regard to the memory medium 110, a second address ADDR2 for accessing the memory medium 110 may include the bank/column/row information with regard to the memory medium 110.

The memory controller 120 may perform a control operation for accessing the memory medium 110 based on a request that is outputted from the host 200. When a read request is generated by the host 200 (i.e., a read command CMD_R and the first address ADDR1 that are transmitted from the host 200 to the memory controller 120), the memory controller 120 may convert the first address ADDR1 into the second address ADDR2 and may read out read data R_DA that is stored in the second address ADDR2 of the memory medium 110. Although not shown in the drawings, when a write command, write data, and the first address ADDR1 are transmitted from the host 200 to the memory controller 120, the memory controller 120 may convert the first address ADDR1 into the second address ADDR2 and may store the write data into a region of the memory medium 110 that is assigned by the second address ADDR2. The memory controller 120 may perform a control operation for error correction while accessing the memory medium 110. The memory controller 120 may also perform a control operation to activate a repair operation to be performed on the memory medium 110.

The memory controller 120 may be configured to include a request handler 121, an address conversion logic circuit 122, an address storage element 123, an error correction logic circuit 124, and a repair logic circuit 125. The request handler 121 may be configured to process a request that is outputted from the host 200. In an embodiment, the read command CMD_R and the first address ADDR1, outputted from the host 200, may be transmitted to the request handler 121. During a read operation of the memory medium 110, the request handler 121 may transmit the first address ADDR1 that is generated by the host 200 to the address conversion logic circuit 122, and a read process may be performed to read out the read data R_DA from the memory medium 110 and transmit the read data R_DA to the host 200. During a write operation of the memory medium 110, the request handler 121 may transmit the first address ADDR1 that is generated by the host 200 to the address conversion logic circuit 122, and a write process may be performed to store write data into the memory medium 110.

The address conversion logic circuit 122 may receive the first address ADDR1 from the request handler 121 and may convert the first address ADDR1 into the second address ADDR2. The address conversion logic circuit 122 may transmit the second address ADDR2 to the memory medium 110. The address conversion logic circuit 122 may transmit the second address ADDR2 to the address storage element 123 in response to a first control signal CS1 that is outputted from the error correction logic circuit 124.

The address storage element 123 may store the second address ADDR2 that is outputted from the address conversion logic circuit 122. The second address ADDR2 may be outputted from the address conversion logic circuit 122 only when the first control signal CS1 is transmitted from the error correction logic circuit 124 to the address conversion logic circuit 122. Thus, the second address ADDR2 may also be stored into the address storage element 123 only when the first control signal CS1 is generated. The address storage element 123 may output the second address ADDR2 to the repair logic circuit 125 in response to an address request signal REQ_ADDR that is outputted from the repair logic circuit 125.

The error correction logic circuit 124 may perform an error correction operation on the read data R_DA that is outputted from the memory medium 110 during the read operation of the memory medium 110. The error correction logic circuit 124 may determine whether the read data R_DA is erroneous data using an error information signal, for example, a parity. When at least one error is detected as a result of the error determination, the error correction logic circuit 124 may perform the error correction operation. The detected errors may be corrected or might not be corrected by the error correction operation. For example, when the number of errors is equal to or less than an error correction capability of the error correction logic circuit 124, the errors may be corrected by the error correction operation. However, when the number of errors is greater than an error correction capability of the error correction logic circuit 124, the errors might not be corrected by the error correction operation. The error correction capability of the error correction logic circuit 124 may be defined as the number of errors (e.g., bits or symbols) that are correctable by using the error correction logic circuit 124.

In an embodiment, when no error is detected or the detected errors have been corrected by the error correction logic circuit 124, the error correction logic circuit 124 may transmit the read data R_DA to the host 200 and the host 200 may terminate a read request. However, when uncorrectable errors are detected, the error correction logic circuit 124 may transmit the first control signal CS1 to the address conversion logic circuit 122 and may transmit a request-stop signal REQ_STOP to the host 200 to request an internal operation time. The internal operation time may be defined as the time it takes an operation to be performed in the memory system 100 regardless of the host 200. The host 200, receiving the request-stop signal REQ_STOP, may terminate all operations of the memory system 100 until a request-resume signal REQ_RESUME is inputted into the host 200. When the detected errors are uncorrectable errors, the error correction logic circuit 124 may transmit a second control signal CS2, requesting a repair operation to the repair logic circuit 125.

The repair logic circuit 125 may perform the repair operation when the second control signal CS2 is transmitted from the error correction logic circuit 124 to the repair logic circuit 125. The repair logic circuit 125 may transmit the address request signal REQ_ADDR to the address storage element 123 to perform the repair operation. When the address storage element 123 transmits the second address ADDR2 to the repair logic circuit 125 in response to the address request signal REQ_ADDR, the repair logic circuit 125 may determine whether a region (at least one memory cell) of the memory medium 110 that is assigned by the second address ADDR2 is repairable.

Whether a region of the memory medium 110, assigned by the second address ADDR2, is repairable may be determined by the status of spare regions that are disposed in the memory medium 110. In an embodiment, a region of the memory medium 110, assigned by the second address ADDR2, may be determined to be repairable when redundant spare regions exist in the memory medium 110. However, a region of the memory medium 110, assigned by the second address ADDR2, may be determined to be unrepairable when the memory medium 110 lacks redundant spare regions (e.g., most of spare regions are in use). In the event that a region of the memory medium 110 that is assigned by the second address ADDR2 is unrepairable, the repair logic circuit 125 may output a failure signal FAIL to the host 200. However, in the event that a region of the memory medium 110 that is assigned by the second address ADDR2 is repairable, the repair logic circuit 125 may perform the repair operation. That is, the repair logic circuit 125 may output a repair signal REPAIR to the memory medium 110 to repair the region of the memory medium 110, designated by bank/column/row, included in the second address ADDR2.

Figure 2:
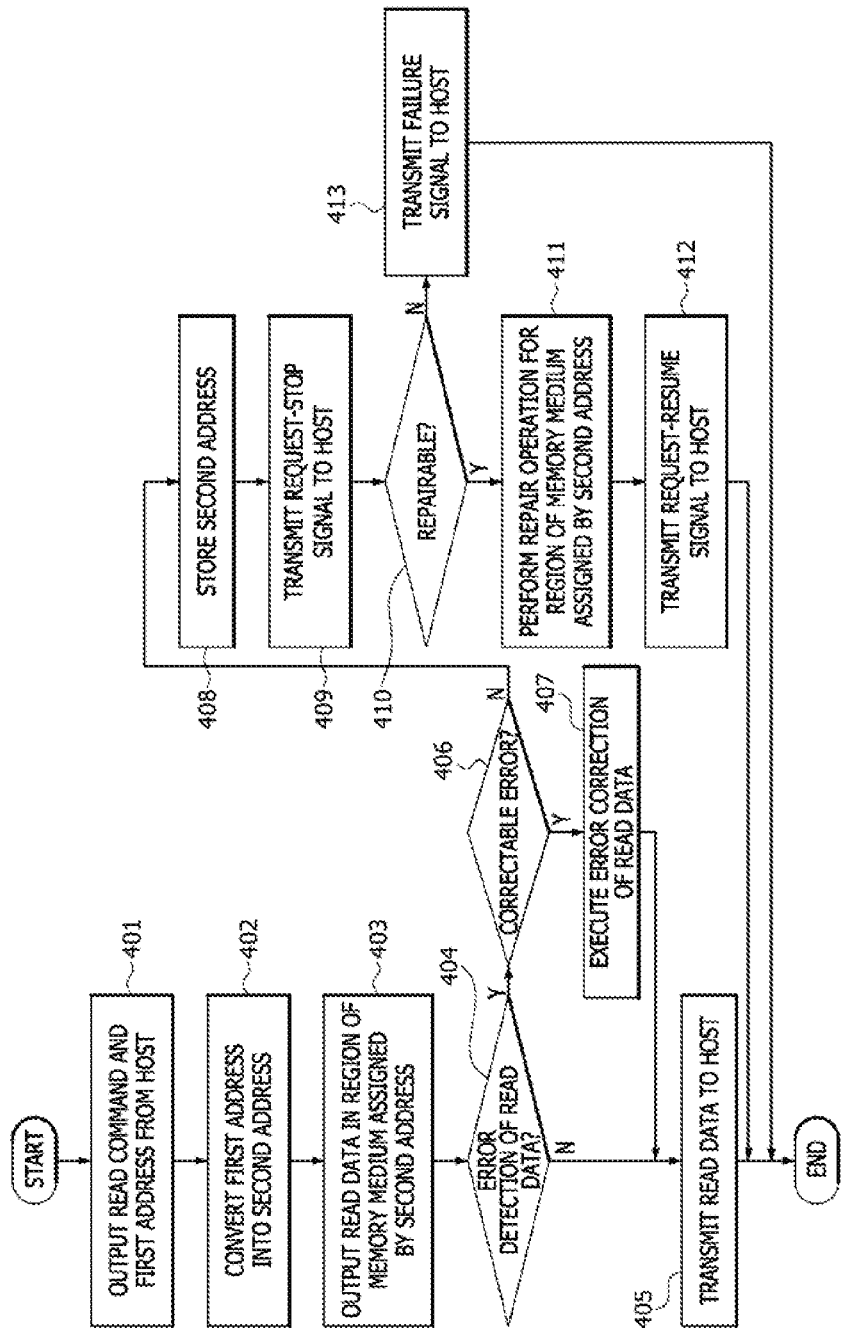
FIG. 2 is a flowchart, illustrating a method of operating a memory system, according to an embodiments of the present disclosure.

FIG. 2 is a flowchart, illustrating a method of operating the memory system 100, shown in FIG. 1. Referring to FIGS. 1 and 2, the read command CMD_R and the first address ADDR1 may be transmitted from the host 200 to the memory controller 120 of the memory system 100 at step 401. The read command CMD_R and the first address ADDR1 may be inputted to the request handler 121 of the memory controller 120. The request handler 121 may output the first address ADDR1 to the address conversion logic circuit 122. At step 402, the address conversion logic circuit 122 may convert the first address ADDR1 into the second address ADDR2 and may transmit the second address ADDR2 to the memory medium 110.

At step 403, the read data R_DA, stored in a region of the memory medium 110 that is assigned by the second address ADDR2, may be outputted. The read data R_DA, outputted from the memory medium 110, may be transmitted to the error correction logic circuit 124. At step 404, the error correction logic circuit 124 may determine whether the read data R_DA is erroneous data. If no error is detected at step 404, the error correction logic circuit 124 may transmit the read data R_DA to the host 200 at step 405. If an error is detected at step 404, the error correction logic circuit 124 may determine whether the detected error is correctable at step 406.

If the detected error is determined to be correctable at step 406, the error correction logic circuit 124 may perform an error correction operation on the read data R_DA at step 407. If the error correction operation on the read data R_DA terminates, the error correction logic circuit 124 may transmit the corrected data of the read data R_DA to the host 200 at step 405. If the detected error is determined to be uncorrectable at step 406, the address storage element 123 may store the second address ADDR2 at step 408. In order to store the second address ADDR2 in the address storage element 123, the error correction logic circuit 124 may transmit the first control signal CS1 to the address conversion logic circuit 122, and the address conversion logic circuit 122 may transmit the second address ADDR2 to the address storage element 123 in response to the first control signal CS1. The address storage element 123 may store the second address ADDR2 in an internal storage region of the address storage element 123.

At step 409, the error correction logic circuit 124 may transmit the request-stop signal REQ_STOP to the host 200. The error correction logic circuit 124 may output the second control signal CS2 to the repair logic circuit 125. At step 410, the repair logic circuit 125 may receive the second control signal CS2 to determine whether the region (i.e., at least one memory cell) of the memory medium 110, designated by the second address ADDR2, is repairable. In order to determine whether the region of the memory medium 110 that is designated by the second address ADDR2 is repairable, the repair logic circuit 125 may transmit the address request signal REQ_ADDR to the address storage element 123. The address storage element 123 may transmit the second address ADDR2 to the repair logic circuit 125 in response to the address request signal REQ_ADDR. If the region of the memory medium 110 that is designated by the second address ADDR2 is repairable at step 410, the repair logic circuit 125 may perform the repair operation on the region of the memory medium 110 that is designated by the second address ADDR2 at step 411. The repair logic circuit 125 may transmit the repair signal REPAIR to repair the region of the memory medium 110 that is designated by the second address ADDR2 to the memory medium 110. The memory medium 110 may perform the repair operation in response to the repair signal REPAIR.

At step 412, the repair logic circuit 125 may transmit the request-resume signal REQ_RESUME to the host 200. The host 200 may request the memory system 100 to perform subsequent operations in response to the request-resume signal REQ_RESUME. Because a repair control operation for the region of the memory medium 110 that is designated by the second address ADDR2 is performed by an internal control operation of the memory system 100, regardless of the first address system of the host 200, the host 200 may regard the first address ADDR1, corresponding to the second address ADDR2, as a normal address to perform a normal request operation during subsequent request operations. If the region of the memory medium 110 that is designated by the second address ADDR2 is unrepairable at step 410, the repair logic circuit 125 may transmit the failure signal FAIL to the host 200 at step 413.

Figure 3:
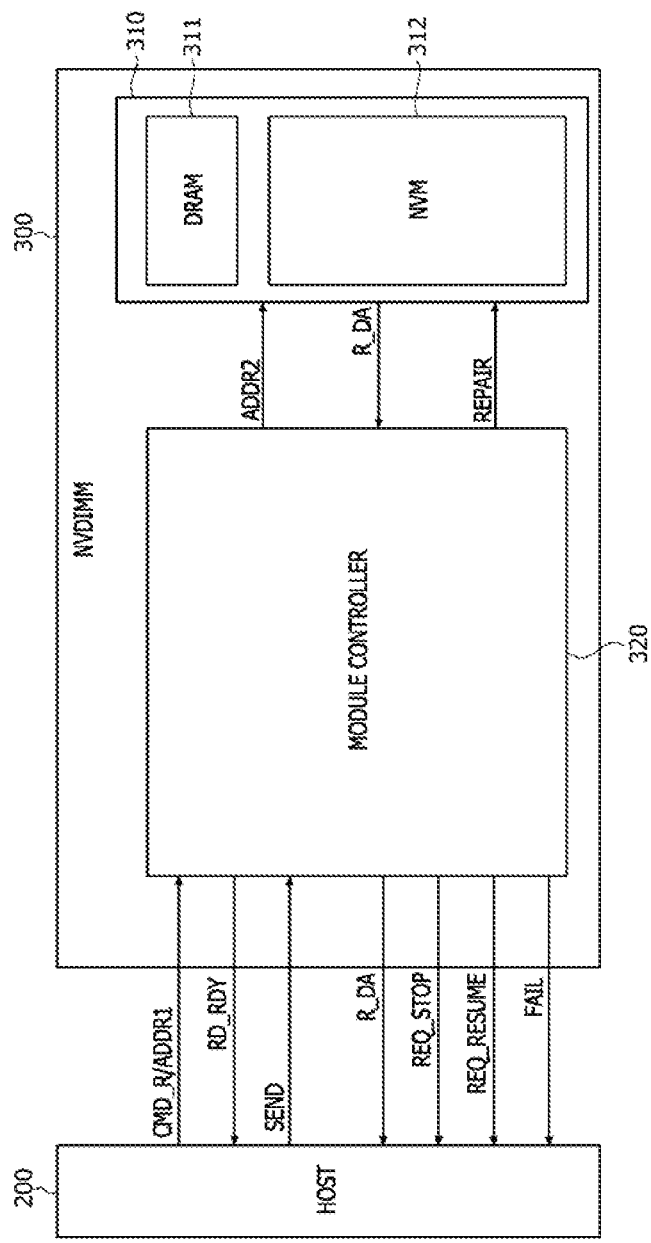
FIG. 3 is a block diagram, illustrating a memory system, according to another embodiment of the present disclosure.

FIG. 3 is a block diagram, illustrating a memory system 300, according to another embodiment of the present disclosure. Referring to FIG. 3, the memory system 300 may be comprised of a nonvolatile memory module, for example, a nonvolatile dual in-line memory module (NVDIMM). Thus, the memory system 300 may be configured to include a memory medium 310 and a module controller 320. The memory medium 310 may include a volatile memory device 311 and a nonvolatile memory device 312. In an embodiment, the volatile memory device 311 of the memory medium 310 may include a dynamic random access memory (DRAM) device, a static random access memory (SRAM) device, a thyristor random access memory (TRAM) device, a zero capacitor random access memory (Z-RAM) device, a twin transistor random access memory (TTRAM) device, or the like. In an embodiment, the nonvolatile memory device 312 of the memory medium 310 may include a magnetic random access memory (MRAM) device, a spin-transfer torque MRAM device, a ferroelectric random access memory (FeRAM) device, a phase change random access memory (PCRAM) device, a resistive random access memory (RRAM) device, or the like.

The module controller 320 may perform a control operation to access to the memory medium 310 based on a request outputted from the host 200. In an embodiment, the module controller 320 may directly access to the volatile memory device 311 of the memory medium 310 based on a request outputted from the host 200, and the module controller 320 may also directly access to the nonvolatile memory device 312 of the memory medium 310 based on a request outputted from the host 200. Although not shown in the drawings, the volatile memory device 311 of the memory medium 310 may directly communicate with the host 200 without passing through the module controller 320. In the present embodiment, the volatile memory device 311 and the nonvolatile memory device 312 constituting the memory medium 310 may have the second address system, which is different from the first address system of the host 200. Alternatively, at least one of the volatile memory device 311 and the nonvolatile memory device 312, constituting the memory medium 310, may have the second address system, which is different from the first address system of the host 200.

If the read command R_DA and the first address ADDR1 are transmitted from the host 200 to the module controller 320 based on a read request of the host 200, the module controller 320 may convert the first address ADDR1 into the second address ADDR2 and may read out the read data R_DA, stored in the region of the memory medium 310, designated by the second address ADDR2. If a write command, write data, and the first address ADDR1 are transmitted from the host 200 to the module controller 320 by a write request of the host 200, the module controller 320 may convert the first address ADDR1 into the second address ADDR2 and may store the write data in the region of the memory medium 310 that is designated by the second address ADDR2. The read data R_DA may correspond to data which is read out from the volatile memory device 311 or the nonvolatile memory device 312 of the memory medium 310 based on a region designated by the second address ADDR2. In an embodiment, if the second address ADDR2 designates a region of the volatile memory device 311 of the memory medium 310, the module controller 320 may output the read data R_DA from the volatile memory device 311 to store the read data R_DA into a buffer of the module controller 320 and may transmit a read-ready completion signal RD_RDY to the host 200. In such a case, the host 200 may transmit a send signal SEND to the module controller 320, and the module controller 320 may transmit the read data R_DA to the host 200 in response to the send signal SEND.

The module controller 320 may perform the error correction operation on the read data R_DA while accessing the memory medium 310 and may also perform the repair operation while accessing the memory medium 310. If no error exists in the read data R_DA during the read operation of the read data R_DA, the module controller 320 may transmit the read data R_DA to the host 200. If an error of the read data R_DA is corrected when the error exists in the read data R_DA, the module controller 320 may transmit the corrected data of the read data R_DA to the host 200. However, if an error of the read data R_DA is uncorrectable, the module controller 320 may stop a request operation of the host 200 and may perform the repair operation on the memory medium 310. In order to stop the request operation of the host 200, the module controller 320 may transmit the request-stop signal REQ_STOP to the host 200.

The module controller 320 may determine whether the region of the memory medium 310, designated by the second address ADDR2, is repairable. If unrepairable, the module controller 320 may transmit the failure signal FAIL to the host 200. If repairable, the module controller 320 may transmit the repair signal REPAIR to repair the region of the memory medium 310 that is designated by the second address ADDR2 to the memory medium 310. More specifically, when the error is determined to be an uncorrectable error, the module controller 320 may store the second address ADDR2 therein and may use the second address ADDR2 during the repair operation. If the repair operation on the memory medium 310 terminates, the module controller 320 may transmit the request-resume signal REQ_RESUME to the host 200. The host 200 may perform a subsequent operation of the memory system 300 in response to the request-resume signal REQ_RESUME.

Figure 4:
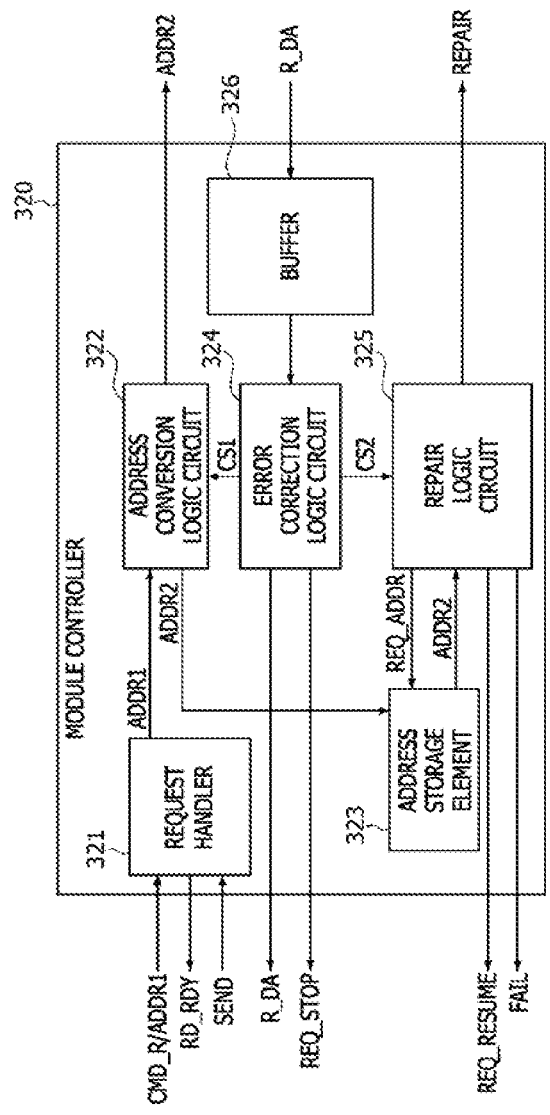
FIG. 4 is a block diagram, illustrating a configuration of a module controller included in a memory system, according to another embodiment of the present disclosure.

FIG. 4 is a block diagram, illustrating a configuration of the module controller 320, included in the memory system 300 of FIG. 3. Referring to FIGS. 3 and 4, the module controller 320 may be configured to include a request handler 321, an address conversion logic circuit 322, an address storage element 323, an error correction logic circuit 324, a repair logic circuit 325, and a buffer 326. The request handler 321, the address conversion logic circuit 322, the address storage element 323, the error correction logic circuit 324, and the repair logic circuit 325, included in the module controller 320, may have the same configuration and function as the request handler 121, the address conversion logic circuit 122, the address storage element 123, the error correction logic circuit 124, and the repair logic circuit 125 that are included in the memory controller 120, described with reference to FIG. 1, respectively. The module controller 320 may include the buffer 326 as mentioned above. The buffer 326 may be used to adjust a difference in the access latency between the volatile memory device 311 and the nonvolatile memory device 312, constituting the memory medium 310. That is, the buffer 326 may temporarily store the read data R_DA that is outputted from the nonvolatile memory device 312 with a relatively long access latency in comparison to the volatile memory device 311. The module controller 320 may access the read data R_DA that is stored in the buffer 326 at an appropriate timing to perform the error correction operation.

An operation of the module controller 320 will be described hereinafter with reference to FIG. 4. If the read command CMD_R and the first address ADDR1 are transmitted from the host 200 to the request handler 321, the request handler 321 may output the first address ADDR1 to the address conversion logic circuit 322. The address conversion logic circuit 322 may convert the first address ADDR1 into the second address ADDR2 and may output the second address ADDR2 to the memory medium 310. The read data R_DA that is outputted from the memory medium 310 may be stored in the buffer 326, and the request handler 321 may transmit the read-ready completion signal RD_RDY to the host 200. If the send signal SEND is transmitted from the host 200 to the module controller 320, the module controller 320 may control the buffer 326 such that the buffer 326 outputs the read data R_DA to the error correction logic circuit 324.

The error correction logic circuit 324 may perform the error correction operation on the read data R_DA. When no error is detected from read data R_DA, the error correction logic circuit 324 may output the read data R_DA to the host 200. However, when at least one error is detected from the read data R_DA, the error correction logic circuit 324 may determine whether the detected error is correctable. If the detected error is correctable, the error correction logic circuit 324 may correct the detected error and may transmit the corrected data of the read data R_DA to the host 200. However, if the detected error is uncorrectable, the error correction logic circuit 324 may transmit the first control signal CS1 to the address conversion logic circuit 322 and may also transmit the second control signal CS2 to the repair logic circuit 325. In addition, in such a case, the error correction logic circuit 324 may transmit the request-stop signal REQ_STOP to the host 200 to request an internal operation time.

The address conversion logic circuit 322 may transmit the second address ADDR2 to the address storage element 323 in response to the first control signal CS1. The repair logic circuit 325 may receive the second control signal CS2 to access the data that is stored in a region of the memory medium 310, designated by the second address ADDR2, and to determine whether the region (at least one memory cell) of the memory medium 310 that is assigned by the second address ADDR2 is repairable. If the region of the memory medium 310 that is assigned by the second address ADDR2 is unrepairable, the repair logic circuit 325 may transmit the failure signal FAIL to the host 200. If the region of the memory medium 310 that is assigned by the second address ADDR2 is repairable, the repair logic circuit 325 may output the repair signal REPAIR to the memory medium 310 to perform the repair operation. In addition, the repair logic circuit 325 may transmit the request-resume signal REQ_RESUME to the host 200.

According to the above embodiments, in the event that a memory medium has a second address system, which is different from a first address system of the host, a repair control operation for a region of the memory medium, designated by a second address, may be performed by an internal control operation of a memory system, including the memory medium, regardless of the first address system of the host. Thus, the host may regard a first address, corresponding to the second address, as a normal address to perform a normal request operation during subsequent request operations.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
   a memory medium configured to have a second address system that is different from a first address system of a host; and
   a memory controller configured to perform a control operation to access the memory medium based on a command from the host,
   wherein the memory controller is configured to store a second address, corresponding to an address of a read data, when an error of the read data that is outputted from the memory medium is uncorrectable and is configured to repair a region of the memory medium, designated by the second address, when the region of the memory medium that is designated by the second address is repairable,
   wherein the memory controller includes an address conversion logic circuit configured to convert a first address into the second address, an address storage element configured to store the second address, an error correction logic circuit configured to perform an error correction operation on the read data,
   wherein the error correction logic circuit transmits a first control signal to the address conversion logic circuit when the read data is uncorrectable;
   wherein the address conversion logic circuit transmits the second address to the address storage element in response to the first control signal; and
   wherein the address storage element stores the second address that is transmitted from the address conversion logic circuit to the address storage element.

2. The memory system of claim 1, wherein the memory medium is comprised of at least one of a volatile memory device and a nonvolatile memory device.

3. The memory system of claim 1, wherein the memory controller repairs the memory medium using the second address.

4. The memory system of claim 1, wherein the memory controller transmits a request-stop signal to the host if the read data are uncorrectable.

5. The memory system of claim 4, wherein the memory controller transmits a request-resume signal to the host after repairing the memory medium.

6. The memory system of claim 1, wherein the memory controller transmits a failure signal to the host when the read data is uncorrectable and the region of the memory medium, storing the read data, is unrepairable.

7. The memory system of claim 1, wherein the memory controller includes:
   a request handler configured to receive the command and the first address from the host;
   a repair logic circuit configured to perform a repair operation on the region of the memory medium that is designated by the second address.

8. The memory system of claim 7,
   wherein the error correction logic circuit transmits a second control signal to the repair logic circuit when the read data is uncorrectable; and
   wherein the repair logic circuit receives the second control signal to transmit a repair signal to the memory medium based on the second address that is stored in the address storage element.

9. The memory system of claim 7,
   wherein the error correction logic circuit transmits a request-stop signal to the host when the read data is uncorrectable; and
   wherein the repair logic circuit transmits a request-resume signal to the host after repairing the memory medium.

10. A memory system including a memory module, the memory module comprising:
    a memory medium configured to include a volatile memory device and a nonvolatile memory device, at least one of which having a second address system that is different from a first address system of a host; and a module controller configured to perform a control operation to access the memory medium based on a command from the host, wherein the memory controller is configured to store a second address, corresponding to an address of a read data, when an error of the read data that is outputted from the memory medium is uncorrectable and is configured to repair a region of the memory medium, designated by the second address, when the region of the memory medium that is designated by the second address is repairable, wherein the module controller includes an address conversion logic circuit configured to convert the first address into the second address, an address storage element configured to store the second address, and an error correction logic circuit configured to perform an error correction operation on the read data, wherein the error correction logic circuit transmits a first control signal to the address conversion logic circuit when the read data is uncorrectable, wherein the address conversion logic circuit transmits the second address to the address storage element in response to the first control signal, and wherein the address storage element stores the second address that is transmitted from the address conversion logic circuit to the address storage element.

11. The memory system of claim 10, wherein the module controller includes:

a request handler configured to receive the command and a first address from the host;

a buffer configured to store the read data outputted from the memory medium;

a repair logic circuit configured to perform a repair operation on the region of the memory medium that is designated by the second address.

12. The memory system of claim 11, wherein the request handler is configured to transmit a read-ready completion signal to the host when the read data is stored into the buffer and is configured to transmit the read data to the error correction logic circuit when a send signal is transmitted from the host to the request handler.

13. The memory system of claim 11, wherein the error correction logic circuit transmits a second control signal to the repair logic circuit when the read data is uncorrectable; and wherein the repair logic circuit receives the second control signal to transmit a repair signal to the memory medium based on the second address that is stored in the address storage element.

14. The memory system of claim 11, wherein the error correction logic circuit transmits a request-stop signal to the host when the read data is uncorrectable; and wherein the repair logic circuit transmits a request-resume signal to the host after repairing the memory medium.

* * * * *